(12) United States Patent
Finnigan

(10) Patent No.: US 7,701,228 B2
(45) Date of Patent: Apr. 20, 2010

(54) SWITCHABLE MANUAL/MOTOR-DRIVEN NMR TUNING SYSTEMS AND METHODS

(75) Inventor: Jim Finnigan, Saratoga, CA (US)

(73) Assignee: Varian, Inc., Palo Alto, CA (US)

( * ) Notice: Subject to any disclaimer, the term of this patent is extended or adjusted under 35 U.S.C. 154(b) by 262 days.

(21) Appl. No.: 12/046,275

(22) Filed: Mar. 11, 2008

(65) Prior Publication Data
US 2009/0230956 A1 Sep. 17, 2009

(51) Int. Cl.
*G01R 27/26* (2006.01)

(52) U.S. Cl. .............. 324/682; 324/307; 324/633; 324/655; 324/675

(58) Field of Classification Search .............. 324/307, 324/633, 655, 668, 675, 682
See application file for complete search history.

(56) References Cited

U.S. PATENT DOCUMENTS 6,323,647 B1  11/2001  Anderson et al.
7,061,745 B2 *  6/2006  Funk et al. .............. 361/272

\* cited by examiner

*Primary Examiner*—Vincent Q Nguyen
(74) *Attorney, Agent, or Firm*—Andrei D. Popovici; Bella Fishman

(57) ABSTRACT

According to some embodiments, motor-tuned nuclear magnetic resonance (NMR) probes may be tuned manually without overcoming the tuning motor holding force. An NMR probe includes a switchable manual-mode/motor-driven mode capacitance-adjustment assembly for adjusting the capacitance of a variable capacitor connected to an NMR RF coil. The capacitance-adjustment assembly includes a tuning shaft coupled to the variable capacitor through a gear assembly, and a mode-switching coupler coupled to the tuning shaft. The mode-switching coupler includes a first terminal coupled to a piezoelectric motor, and a second terminal coupled to the tuning shaft. In the manual mode, a user pushes up the tuning shaft, decoupling the two terminals of the mode-switching coupler and thus decoupling the motor from the tuning shaft. The user then manually rotates the tuning shaft. In the motor-driven mode, a spring tensioner presses the two terminals of the mode-switching coupler together, coupling the motor to the tuning shaft.

18 Claims, 3 Drawing Sheets

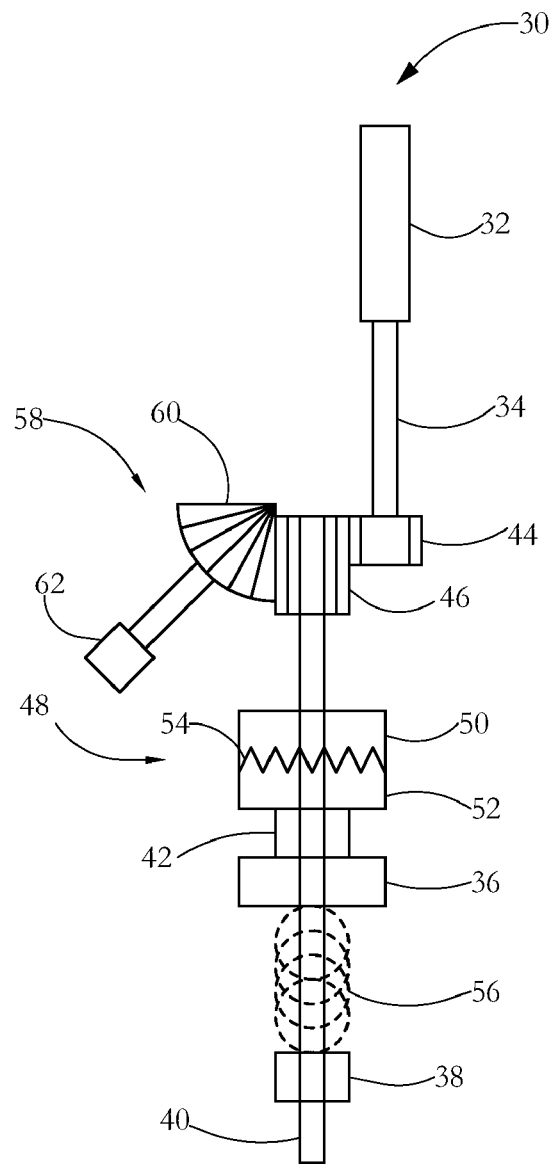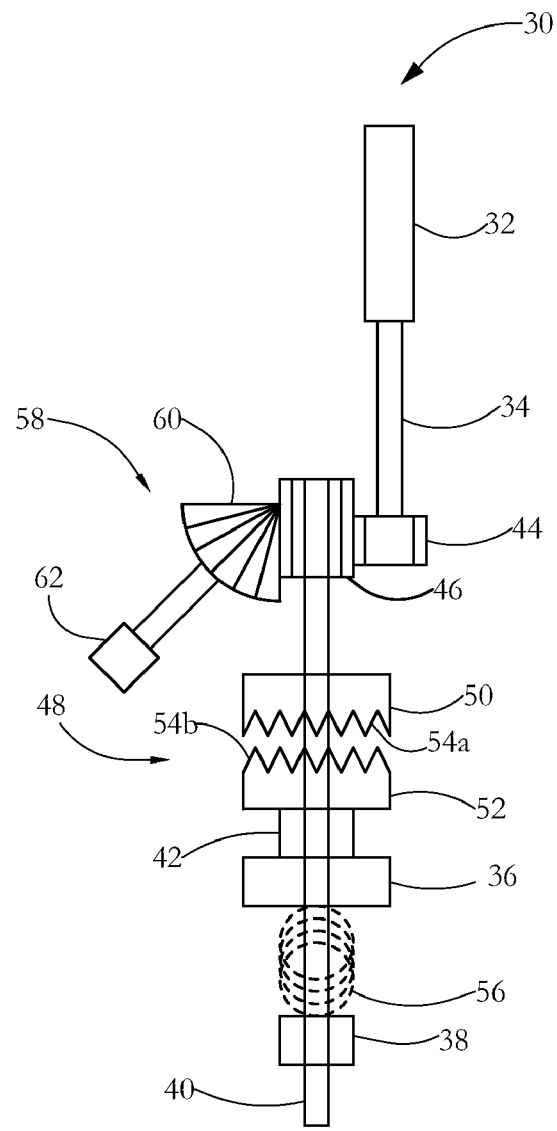
FIG. 2-A  FIG. 2-B

SWITCHABLE MANUAL/MOTOR-DRIVEN NMR TUNING SYSTEMS AND METHODS

FIELD OF THE INVENTION

This invention relates to magnetic resonance system and methods, and in particular to capacitor systems and methods for tuning NMR probes.

BACKGROUND OF THE INVENTION

Nuclear magnetic resonance (NMR) spectrometers typically include a superconducting magnet for generating a static magnetic field $B_0$, and an NMR probe including one or more special-purpose radio-frequency (RF) coils for generating a time-varying magnetic field $B_1$ perpendicular to the field $B_0$, and for detecting the response of a sample to the applied magnetic fields. Each RF coil and associated circuitry can resonate at the Larmor frequency of a nucleus of interest present in the sample. The RF coils are typically provided as part of an NMR probe, and are used to analyze samples situated in sample tubes or flow cells.

An NMR frequency of interest is determined by the nucleus of interest and the strength of the applied static magnetic field $B_0$. In order to maximize the sensitivity of NMR measurements, the resonant frequency of the excitation/detection circuitry is set to be equal to the frequency of interest. The resonant frequency of the excitation/detection circuitry varies as $$v = \frac{1}{2\pi\sqrt{LC}} \qquad [1]$$

where L and C are the effective inductance and capacitance, respectively, of the excitation/detection circuitry. Additionally, in order to maximize the transfer of RF energy into the RF coils, the impedance of each coil is matched to the impedance of the transmission line with a network of components electrically connected to the RF coil. If the coil is not impedance-matched, a sub-optimal fraction of the RF energy sent to the coil actually enters the coil. The rest of the energy is reflected, and does not contribute to the NMR measurement. Variable and fixed capacitors as well as inductors may be used to set the NMR circuit resonant frequency to desired values and to ensure optimal impedance matching.

In U.S. Pat. No. 6,323,647, Anderson et al. describe an apparatus for tuning and/or matching a RF coil in a NMR probe comprising a first variable capacitor electrically connected to the coil and a first motor capable of coupling to the first variable capacitor. The first motor when coupled to the first capacitor adjusts a capacitance associated with the first capacitor. The first motor is capable of operating in a strong magnetic field and is capable of not disturbing homogeneity of the magnetic field when the motor is not operating. In a preferred embodiment of Anderson et al, the motor is a piezoelectric motor, in which an oscillator electrical voltage applied to a piezoelectric material produces a moving or rotating wave, which is coupled to a friction plate causing the plate to move or rotate.

SUMMARY OF THE INVENTION

Exemplary systems and methods according to embodiments the present invention allow manually tuning motor-tuned NMR probes without a need to overcome a holding force of the tuning motor. According to one aspect, a nuclear magnetic resonance apparatus comprises a radio-frequency nuclear magnetic resonance coil, a variable capacitor electrically connected to the radio-frequency coil, and a switchable manual-mode/motor-driven mode tuning assembly coupled to the variable capacitor, for adjusting a capacitance of the variable capacitor. The tuning assembly comprises an axially-rotatable longitudinal tuning shaft coupled to the variable capacitor; a manual control coupled to the tuning shaft when the tuning assembly is in a manual mode, for manually rotating the tuning shaft to adjust the capacitance of the variable capacitor; a tuning motor coupled to the tuning shaft when the tuning assembly is in a motor-driven mode, and de-coupled from the tuning shaft when the tuning assembly is in the manual mode, for driving a rotation of the tuning shaft to adjust the capacitance of the variable capacitor; and a mode-switching coupler coupling the tuning motor to the tuning shaft when the tuning assembly is in the motor-driven mode. The coupler comprises a first coupler terminal connected to the tuning motor and a second coupler terminal connected to the tuning shaft. In the motor-driven mode, the first coupler terminal is coupled to and drives an axial rotation of the second coupler terminal. In the manual mode, the first coupler terminal is longitudinally separated from and rotationally-decoupled from the second coupler terminal.

According to another aspect, a nuclear magnetic resonance apparatus for tuning a nuclear magnetic resonance circuit including a radio-frequency nuclear magnetic resonance coil comprises a variable capacitor electrically connected to the radio-frequency coil, and a switchable manual-mode/motor-driven mode tuning assembly coupled to the variable capacitor, for adjusting a capacitance of the variable capacitor. The tuning assembly comprises an axially-rotatable longitudinal tuning shaft coupled to the variable capacitor; a manual control coupled to the tuning shaft when the tuning assembly is in a manual mode, for manually rotating the tuning shaft to adjust the capacitance of the variable capacitor; a tuning motor coupled to the tuning shaft when the tuning assembly is in a motor-driven mode, and de-coupled from the tuning shaft when the tuning assembly is in the manual mode, for driving a rotation of the tuning shaft to adjust the capacitance of the variable capacitor; and a mode-switching coupler selectively coupling the tuning motor to the tuning shaft when the tuning assembly is in the motor-driven mode, and de-coupling the tuning motor from the tuning shaft when the tuning assembly is in the manual mode.

According to another aspect, a method comprises setting a switchable manual mode/motor-driven mode tuning assembly of a nuclear magnetic resonance probe alternatively to a manual-mode and a motor-driven mode by intercoupling or decoupling a first coupler terminal and a second coupler terminal of a mode-switching coupler. The first coupler terminal is coupled to a tuning motor, and the second coupler terminal is coupled to an axially-rotatable tuning shaft, the tuning shaft being connected to a variable capacitor, the variable capacitor being electrically connected to a radio-frequency nuclear magnetic resonance coil, wherein in the motor-driven mode the first coupler terminal is coupled to and drives an axial rotation of the second coupler terminal, and wherein in the manual mode the first coupler terminal is longitudinally separated from and rotationally-decoupled from the second coupler terminal. The method further comprises adjusting a capacitance of the variable capacitor by using the tuning motor to drive a rotation of the tuning shaft when the tuning assembly is in the motor-driven mode, and adjusting the capacitance of the variable capacitor by manually rotating the tuning shaft when the tuning assembly is in the manual mode.

BRIEF DESCRIPTION OF THE DRAWINGS

The foregoing aspects and advantages of the present invention will become better understood upon reading the following detailed description and upon reference to the drawings where:

FIG. 2-A-B show a switchable manual/motor-driven NMR probe tuning assembly in motor-driven and manual tuning states, respectively, according to some embodiments of the present invention.

DETAILED DESCRIPTION OF THE INVENTION

The following description illustrates the present invention by way of example and not necessarily by way of limitation. Any reference to an element is understood to refer to at least one element. A set of elements is understood to include one or more elements. A plurality of elements includes at least two elements. Each recited element or structure can be formed by or be part of a monolithic structure, or be formed from multiple distinct structures. Any recited electrical or mechanical connections can be direct connections or indirect operative connections established through intermediary circuit elements or structures. For example, a radio-frequency NMR coil may be connected to a capacitor through a number of circuit components.

The following description illustrates embodiments of the invention by way of example and not necessarily by way of limitation.

Figure 1:
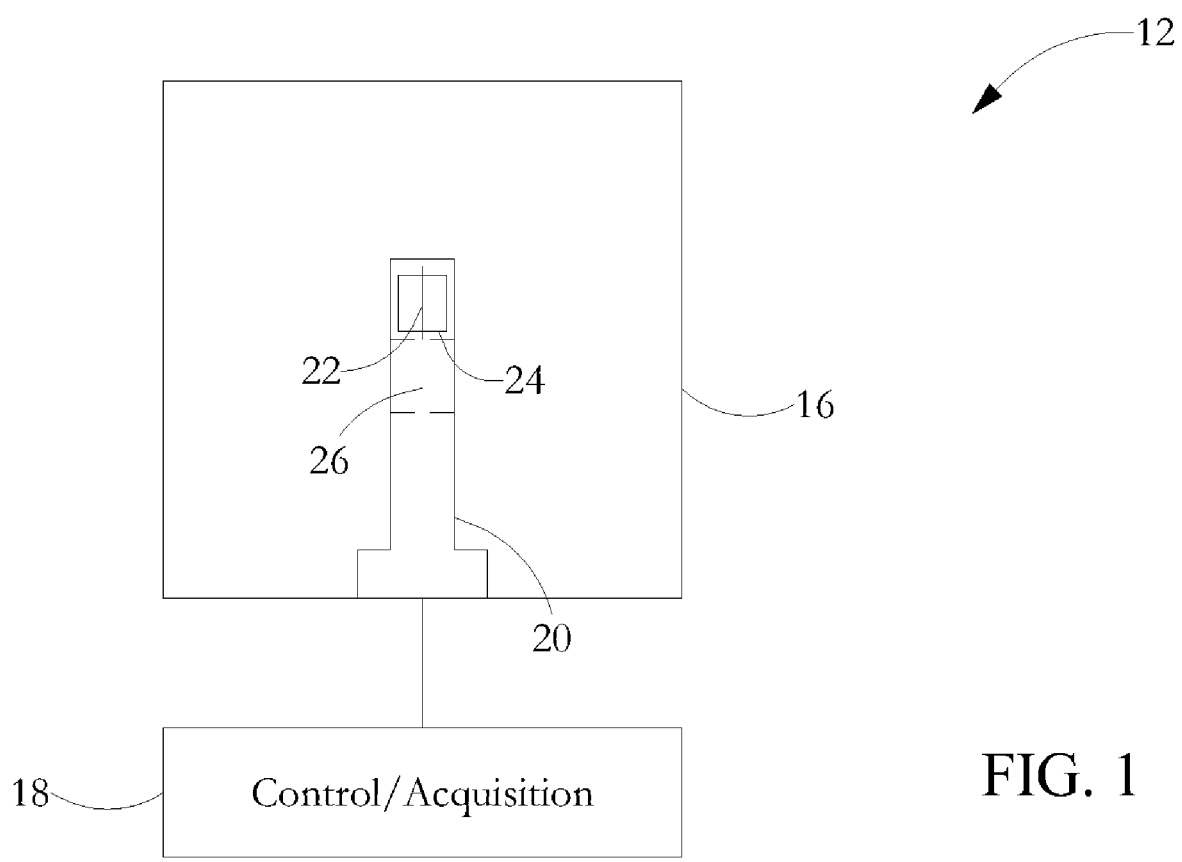
FIG. 1 is a schematic diagram of an exemplary NMR spectrometer according to some embodiments of the present invention.

FIG. 1 is a schematic diagram illustrating an exemplary nuclear magnetic resonance (NMR) spectrometer 12 according to an embodiment of the present invention. Spectrometer 12 comprises a magnet 16, an NMR probe 20 inserted in a cylindrical bore of magnet 16, and a control/acquisition system 18 electrically connected to magnet 16 and probe 20. Probe 20 includes one or more radio-frequency (RF) coils 24 and associated electrical circuit components. For simplicity, the following discussion will focus on a single coil 24, although it is understood that a system may include other similar coils. A sample container 22 is positioned within probe 20, for holding an NMR sample of interest within coil 24 while measurements are performed on the sample. Sample container 22 may be a sample tube or a flow cell. A number of electrical circuit components such as capacitors, inductors, and other components are situated in a circuit region 26 of probe 20, and are connected to coil 24. Coil 24 and the various components connected to coil 24 form one or more NMR measurement circuits. Circuit region 26 is situated adjacent to coil 24, immediately underneath coil 24.

To perform a measurement, a sample is inserted into a measurement space defined within coil 24. Magnet 16 applies a static magnetic field $B_0$ to the sample held within sample container 22. Control/acquisition system 18 comprises electronic components configured to apply desired radio-frequency pulses to probe 20, and to acquire data indicative of the nuclear magnetic resonance properties of the samples within probe 20. Coil 24 is used to apply radio-frequency magnetic fields $B_1$ to the sample, and/or to measure the response of the sample to the applied magnetic fields. The RF magnetic fields are perpendicular to the static magnetic field. The same coil may be used for both applying an RF magnetic field and for measuring the sample response to the applied magnetic field. Alternatively, one coil may be used for applying an RF magnetic field, and another coil for measuring the response of the sample to the applied magnetic field. A single coil may be used to perform measurements at multiple frequencies, by tuning the resonant frequency of the NMR measurement circuit that includes the coil. Tuning the circuit resonant frequency may be achieved by adjusting the capacitance values of one or more variable capacitors included in the circuit. Adjusting one or more capacitance values may also be used to achieve impedance matching or other desired circuit characteristics.

FIGS. 2-A-B show a switchable manual-mode/motor-driven mode NMR probe tuning assembly 30 in motor-drive and manual-tuning states, respectively, according to some embodiments of the present invention. Assembly 30 includes a variable capacitor 32, which is electrically connected to RF coil(s) 24 and forms part of an NMR measurement circuit including RF coil(s) 24. Variable capacitor 32 is connected to a longitudinal transmission shaft 34. Axially rotating transmission shaft 34 controls the variable capacitance of capacitor 32. Transmission shaft 34 is coupled to a longitudinal tuning shaft 40 through a pair of gear wheels (gears) 44, 46 centered on shafts 34, 40, respectively. The axial rotation of gear wheel 46 is controlled alternatively by motor 36 or a manual control (tuning knob) 38 rigidly coupled to tuning shaft 40. Tuning shaft 40 passes through a central longitudinal aperture defined through motor 36. Motor 36 is electrically connected to a power source and to control/acquisition system 18 (FIG. 1).

A mode-switching coupler 48 includes upper and lower mating coupler terminals 50, 52 capable of axially-locking together along a mating interface 54 when tuning assembly 30 is in a motor-driven state (FIG. 2-A), or disengaging from each other when tuning assembly 30 is in a manual-tuning state (FIG. 2-B). Upper terminal 50 is rigidly coupled to tuning shaft 40, while lower terminal 52 is rigidly coupled to a piezoelectric motor 36 through a motor-coupling shaft 42. Motor-coupling shaft 42 is formed by an outer tube concentric with and enclosing tuning shaft 40. Motor 36 drives a rotation of lower terminal 52 through motor-coupling shaft 42. Terminal 52 is longitudinally-fixed, while terminal 50 is longitudinally-movable with respect to terminal 52 between coupled and de-coupled state positions. Tuning shaft 40, motor-coupling shaft 42, and mode-switching coupler 48 can be thought to form or be part of a mode-switching tuning shaft assembly.

Coupler terminals 50, 52 include interlocking mating surfaces 54a-b facing each other. Mating surfaces 54a-b include azimuthally-symmetric, matching longitudinal locking patterns (protrusions, textures) capable of interlocking mating surfaces 54a-b regardless of the azimuthal (rotational) position of mating surfaces 54a-b. Terminals 50, 52 can engage/disengage and become rotationally coupled or decoupled regardless of their relative azimuthal orientation. When terminals 50, 52 are brought together longitudinally, mating surfaces 54a-b attach to each other, interlocking terminals 50, 52 and coupling piezoelectric motor 36 to tuning shaft 40. Piezoelectric motor 36 then drives the rotation of tuning shaft 40, which in turn drives the rotation of transmission shaft 34 to allow adjusting the capacitance of capacitor 32 to a desired value. When terminal 50 is moved longitudinally away from terminal 52, for example by a user's hand pushing manual control 38 upward, terminals 50, 52 disengage from each other and piezoelectric motor 36 becomes decoupled from the rotation of tuning shaft 40. In some embodiments, a user may employ a screwdriver or other tool to push tuning shaft 40 upward. After tuning shaft 40 is rotated, the user simply removes the upward force on tuning shaft 40, and terminals 50, 52 are brought together.

A longitudinal spring tensioner 56 is positioned between motor 36, which is fixed, and a tuning knob 38 or another longitudinally-movable structure rigidly coupled to tuning shaft 40. Spring tensioner 56 pushes terminals 50, 52 together in the default, motor-driven configuration of tuning assembly 30 (FIG. 2-A). When a user pushes up tuning shaft 40, spring tensioner 56 is compressed as terminal 50 is pushed upward. Tuning shaft 40 passes through the central aperture of motor 36, pushing gear wheel 46 to slide upward along gear wheel 44 while maintaining the rotational coupling between gear wheels 44, 46. When a user removes the upward force applied to tuning shaft, 40, gravity and the restoring force of spring tensioner 56 bring terminals 50, 52 together. In some embodiments, spring tensioner 56 may be positioned between different structures, one of which is longitudinally fixed and the other longitudinally-movable together with tuning shaft 40. For example, spring tensioner 56 may be compressed between coupler terminal 50 and a fixed stop situated above coupler terminal 50.

A shaft encoder 58 includes an encoder gear wheel 60 coupled to gear wheel 46, and an encoder body coupled to encoder gear wheel 60. Shaft encoder 58 is used to count the number of turns of tuning shaft 40 in both the motor-driven and manual tuning modes.

Figure 3:
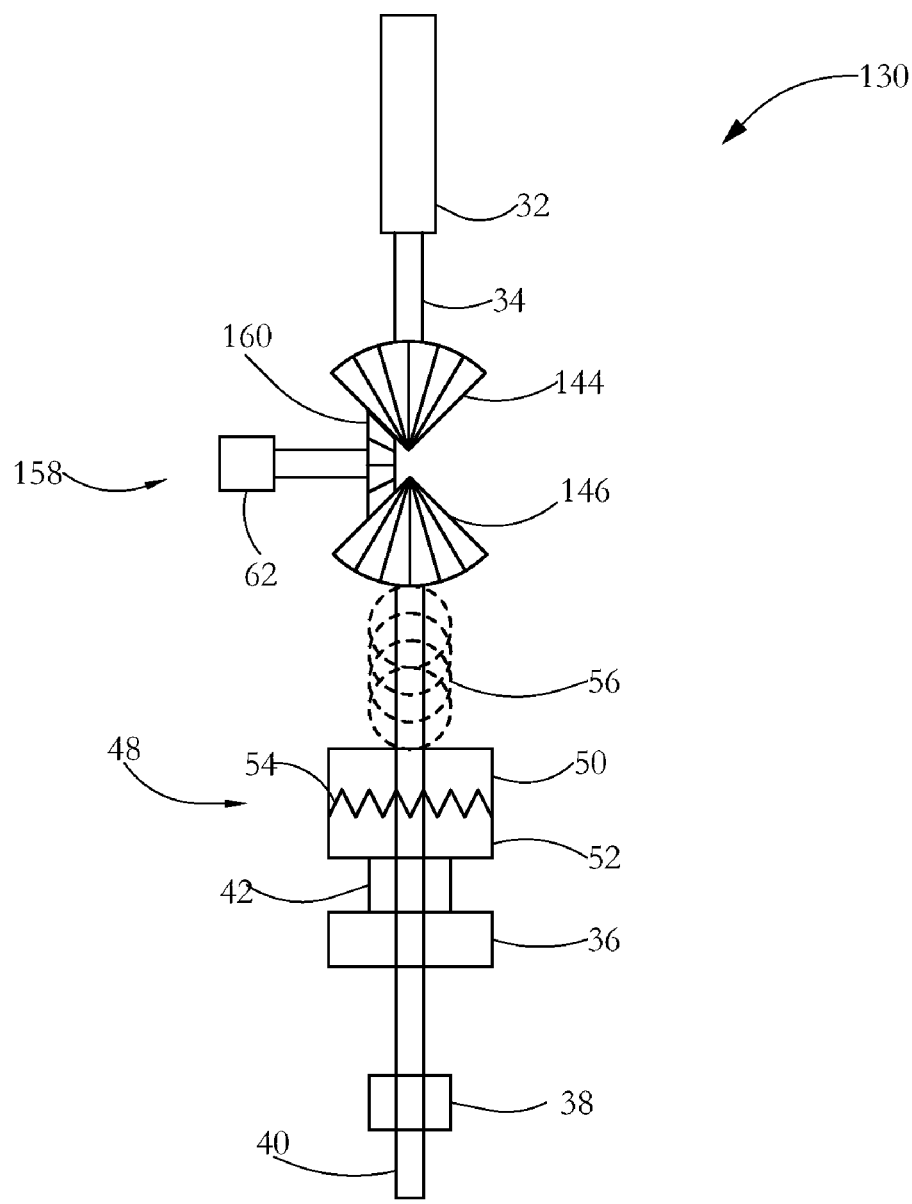
FIG. 3 shows a switchable manual/motor-driven NMR probe tuning assembly according to some embodiments of the present invention.

FIG. 3 shows a switchable manual/motor-driven NMR probe tuning assembly 130 according to some embodiments of the present invention. Tuning assembly 130 includes a pair of opposing gears 144, 146 coupled to transmission shaft 34 and tuning shaft 40, respectively. Gears 144, 146 are coupled to each other through an encoding gear 160 disposed between gears 144, 146. Coupling gear 160 forms part of a shaft encoder 158, which includes an encoder body 62 coupled to encoding gear wheel 160. Rotating tuning shaft 40 causes gear 146 to rotate. Coupling gear 160 couples gear 146 to gear 144, causing gear 144 to rotate and thus adjust the capacitance of capacitor 32 to a desired value. Spring tensioner 56 is positioned generally between coupler terminal 50 and gear 146. Pushing upward tuning shaft 40 pushes up coupler terminal 50, decoupling coupler terminal 50 from coupler terminal 52 and thus decoupling the rotation of tuning shaft 40 from any resistance/holding force of motor 36. A central longitudinal aperture (e.g. a keyed aperture) defined inside gear 146 may accommodate varying extents of tuning shaft 40 as tuning shaft 40 is moved longitudinally between its coupling and decoupling positions, while maintaining the rotational coupling between tuning shaft 40 and gear 146.

The systems and methods described above allow adjusting the capacitances of one or more capacitors in an NMR probe manually or using a piezoelectric or other motor, as desired. Piezoelectric motors exhibit particularly high drag or resistance to motor motion while the motor is off. Manual tuning may be particularly useful when the probe is not connected to a power source and/or electronics suitable for driving and controlling the tuning motor.

The above embodiments may be altered in many ways without departing from the scope of the invention. Accordingly, the scope of the invention should be determined by the following claims and their legal equivalents.

What is claimed is:

1. A nuclear magnetic resonance apparatus comprising:
    a radio-frequency nuclear magnetic resonance coil;
    a variable capacitor electrically connected to the radio-frequency coil; and
    a switchable manual-mode/motor-driven mode tuning assembly coupled to the variable capacitor, for adjusting a capacitance of the variable capacitor, comprising
        an axially-rotatable longitudinal tuning shaft coupled to the variable capacitor;
        a manual control coupled to the tuning shaft when the tuning assembly is in a manual mode, for manually rotating the tuning shaft to adjust the capacitance of the variable capacitor;
        a tuning motor coupled to the tuning shaft when the tuning assembly is in a motor-driven mode, and de-coupled from the tuning shaft when the tuning assembly is in the manual mode, for driving a rotation of the tuning shaft to adjust the capacitance of the variable capacitor; and
        a mode-switching coupler coupling the tuning motor to the tuning shaft when the tuning assembly is in the motor-driven mode, the coupler comprising a first coupler terminal connected to the tuning motor and a second coupler terminal connected to the tuning shaft, wherein in the motor-driven mode the first coupler terminal is coupled to and drives an axial rotation of the second coupler terminal, and wherein in the manual mode the first coupler terminal is longitudinally separated from and rotationally-decoupled from the second coupler terminal.

2. The apparatus of claim 1, wherein the tuning motor comprises a central longitudinal aperture, the tuning shaft passing through the central longitudinal aperture.

3. The apparatus of claim 1, further comprising a gear assembly coupling the tuning shaft to a longitudinal transmission shaft, wherein a rotation of the transmission shaft drives a motion of at least one electrode of the variable capacitor, the gear assembly comprising a first gear driven by the tuning shaft and a second gear coupled to the first gear, the second gear driving the rotation of the transmission shaft.

4. The apparatus of claim 3, further comprising a shaft encoder coupled to the gear assembly, for counting a number of turns of at least one gear of the gear assembly.

5. The apparatus of claim 3, wherein the gear assembly comprises:
    a first gear driven by the tuning shaft, the first gear having a first longitudinal rotation axis; and
    a second gear driven by the first gear and driving the transmission shaft, the second gear having a second longitudinal rotation axis parallel to and not coinciding with the first longitudinal rotation axis.

6. The apparatus of claim 5, wherein the gear assembly comprises:
    a first gear driven by the tuning shaft, the first gear having a first longitudinal rotation axis;
    a second gear driven by the second gear and driving the transmission shaft, the second gear having a second longitudinal rotation axis coinciding with the first longitudinal rotation axis; and
    a shaft encoder gear coupling the first gear to the second gear, the shaft encoder gear having a transverse rotation axis orthogonal to the first longitudinal rotation axis.

7. The apparatus of claim 1, further comprising a longitudinal spring tensioner longitudinally pressing the first coupler terminal and the second coupler terminal together.

8. The apparatus of claim 1, wherein the tuning motor is a piezoelectric motor.

9. A nuclear magnetic resonance apparatus for tuning a nuclear magnetic resonance circuit including a radio-frequency nuclear magnetic resonance coil, comprising:
    a variable capacitor electrically connected to the radio-frequency coil; and a switchable manual-mode/motor-driven mode tuning assembly coupled to the variable capacitor, for adjusting a capacitance of the variable capacitor, comprising
an axially-rotatable longitudinal tuning shaft coupled to the variable capacitor;
a manual control coupled to the tuning shaft when the tuning assembly is in a manual mode, for manually rotating the tuning shaft to adjust the capacitance of the variable capacitor;
a tuning motor coupled to the tuning shaft when the tuning assembly is in a motor-driven mode, and de-coupled from the tuning shaft when the tuning assembly is in the manual mode, for driving a rotation of the tuning shaft to adjust the capacitance of the variable capacitor; and
a mode-switching coupler selectively coupling the tuning motor to the tuning shaft when the tuning assembly is in the motor-driven mode, and de-coupling the tuning motor from the tuning shaft when the tuning assembly is in the manual mode.

10. A method comprising:
setting a switchable manual mode/motor-driven mode tuning assembly of a nuclear magnetic resonance probe alternatively to a manual-mode and a motor-driven mode by intercoupling or decoupling a first coupler terminal and a second coupler terminal of a mode-switching coupler, the first coupler terminal being coupled to a tuning motor, the second coupler terminal being coupled to an axially-rotatable tuning shaft, the tuning shaft being connected to a variable capacitor, the variable capacitor being electrically connected to a radio-frequency nuclear magnetic resonance coil, wherein in the motor-driven mode the first coupler terminal is coupled to and drives an axial rotation of the second coupler terminal, and wherein in the manual mode the first coupler terminal is longitudinally separated from and rotationally-decoupled from the second coupler terminal;
when the tuning assembly is in the motor-driven mode, adjusting a capacitance of the variable capacitor by using the tuning motor to drive a rotation of the tuning shaft; and
when the tuning assembly is in the manual mode, adjusting the capacitance of the variable capacitor by manually rotating the tuning shaft.

11. The method of claim 10, comprising axially rotating the tuning shaft through a central longitudinal aperture defined through the tuning motor.

12. The method of claim 10, further comprising employing a gear assembly to couple the tuning shaft to a longitudinal transmission shaft, wherein a rotation of the transmission shaft drives a motion of at least one electrode of the variable capacitor, the gear assembly comprising a first gear driven by the tuning shaft and a second gear coupled to the first gear, the second gear driving the rotation of the transmission shaft.

13. The method of claim 12, further comprising employing a shaft encoder coupled to the gear assembly to count a number of turns of at least one gear of the gear assembly.

14. The method of claim 12, wherein the gear assembly comprises:
a first gear driven by the tuning shaft, the first gear having a first longitudinal rotation axis; and
a second gear driven by the first gear and driving the transmission shaft, the second gear having a second longitudinal rotation axis parallel to and not coinciding with the first longitudinal rotation axis.

15. The method of claim 12, wherein the gear assembly comprises:
a first gear driven by the tuning shaft, the first gear having a first longitudinal rotation axis;
a second gear driven by the second gear and driving the transmission shaft, the second gear having a second longitudinal rotation axis coinciding with the first longitudinal rotation axis; and
a shaft encoder gear coupling the first gear to the second gear, the shaft encoder gear having a transverse rotation axis orthogonal to the first longitudinal rotation axis.

16. The method of claim 10, further comprising employing a longitudinal spring tensioner to longitudinally press the first coupler terminal and the second coupler terminal together.

17. The method of claim 10, wherein the tuning motor is a piezoelectric motor.

18. A method of tuning a nuclear magnetic resonance circuit including a radio-frequency nuclear magnetic resonance coil, the method comprising:
setting a switchable manual mode/motor-driven mode tuning assembly of a nuclear magnetic resonance probe alternatively to a manual-mode and a motor-driven mode, wherein in the motor-driven mode the tuning motor is coupled to and drives an axial rotation of a tuning shaft, and wherein in the manual mode the tuning motor is rotationally-decoupled from the tuning shaft;
when the tuning assembly is in the motor-driven mode, adjusting a capacitance of the variable capacitor by using the tuning motor to drive a rotation of the tuning shaft; and
when the tuning assembly is in the manual mode, adjusting the capacitance of the variable capacitor by manually rotating the tuning shaft.

* * * * *